United States Patent
Namioka

(10) Patent No.: US 8,120,043 B2
(45) Date of Patent: Feb. 21, 2012

(54) SURFACE MOUNT DEVICE

(75) Inventor: Kaori Namioka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 206 days.

(21) Appl. No.: 12/494,254

(22) Filed: Jun. 29, 2009

(65) Prior Publication Data

US 2009/0321750 A1     Dec. 31, 2009

(30) Foreign Application Priority Data

Jun. 27, 2008 (JP) ................... 2008-168579

(51) Int. Cl.
*H01L 27/15* (2006.01)
(52) U.S. Cl. ............... 257/81; 257/99; 257/E33.056; 257/E33.076
(58) Field of Classification Search ............ 257/81, 257/99, E33.076, E33.056
See application file for complete search history.

(56) References Cited

U.S. PATENT DOCUMENTS

| | | | |
|---|---|---|---|
| 2005/0093146 A1 | 5/2005 | Sakano | |
| 2006/0231952 A1* | 10/2006 | Kim et al. | 257/738 |
| 2006/0244117 A1* | 11/2006 | Karnezos et al. | 257/678 |
| 2007/0187818 A1* | 8/2007 | Lyne | 257/734 |
| 2008/0023711 A1* | 1/2008 | Tarsa et al. | 257/98 |
| 2008/0128894 A1 | 6/2008 | Sakano | |

FOREIGN PATENT DOCUMENTS

JP     2005-159311 A     6/2005

* cited by examiner

*Primary Examiner* — Bradley K Smith
*Assistant Examiner* — Mohammad T Karimy
(74) *Attorney, Agent, or Firm* — Kenealy Vaidya LLP

(57) ABSTRACT

The disclosed subject matter is directed to a reliable surface mount device using a ceramic package, and includes LED devices that are simply composed and incorporate the use of the surface mount device. The surface mount device can include a ceramic package, a semiconductor optical chip mounted in the package, two soldering pads electrically connected to the chip electrodes and at least one dummy soldering pad located on either side of the soldering pads. Thermal fatigue located at or in the soldering connections connecting the chip electrodes to a mounting board can be reduced because the distance between the soldering pads can be reduced. The dummy soldering pad that is electrically insulated can allow the device to maintain a desirable location with poise during the reflow soldering process that occurs during manufacture, and can also reduce shear stress present at the soldering connections. Thus, the surface mount device and the LED device using the disclosed structure can maintain a high reliability even under harsh environmental conditions.

22 Claims, 8 Drawing Sheets

SURFACE MOUNT DEVICE

This application claims the priority benefit under 35 U.S.C. §119 of Japanese Patent Application No. 2008-168579 filed on Jun. 27, 2008, which is hereby incorporated in its entirety by reference.

BACKGROUND

1. Field

The presently disclosed subject matter relates to surface mount devices, and more particularly to reliable surface mount devices including a ceramic package and a semiconductor optical chip such as an LED, a laser diode, a photo diode, etc.

2. Description of the Related Art

Surface mount devices are used for semiconductor light-emitting devices such as an LED and the like and for semiconductor light-receiving devices such as a photo transistor, etc. Surface mount LED devices are used for LCD back light units in mobile phones, digital video cameras, PDAs, etc., since white LEDs have been available on the market. Surface mount LED devices have been recently employed as a light source for vehicle lamps and for general lighting and the general application of LEDs and other surface mount lighting devices have been expanded.

Surface mount devices have also been miniaturized. However, because it is desired for semiconductor light-emitting/light-receiving devices to emit/receive greater amounts of light flux (and in view of the above-described applications being expanded from small size usage such as in indicators, to larger size usages such as in general lighting and vehicle lamp lighting), demand has increased for surface mount devices that can be used for a high flux type apparatus and/or a wide-screen apparatus.

However, because high flux type LEDs are generally driven by a large current, their rated wattages and heating values become large, and also the high flux type LEDs are frequently used under a harsh environment such as high temperature and high humidity and the like, especially when they are used for vehicle lamps, outdoor lighting, etc. A ceramic package has been used for the surface mount devices because the ceramic package has a high radiating performance and a good heat resistance property as compared with either a resin molding package or a plastic package.

A conventional semiconductor device and method for manufacturing the same using a ceramic package is disclosed in patent document No. 1 (Japanese Patent Application Laid Open JP2005-159311). FIGS. 1a and 1b are front and side views, respectively, depicting a conventional side view type semiconductor device using a ceramic package that is disclosed in patent document No. 1.

The conventional side view type LED light source 1 includes: a ceramic package 2; an LED chip 4 mounted in the ceramic package 2 so as to emit light parallel to a mounting surface of a mounting board 5; and electrode pads 3a and 3b located so as to face the mounting surface. When the LED light source 1 is mounted on the mounting surface, the LED light source 1 can be mounted on the mounting board 5 by fixing each of the electrode pads 3a, 3b thereof to conductor patterns 6a, 7b formed on the mounting board 5 via solders 7a, 7b, respectively.

A method for manufacturing the ceramic package 2 includes: providing an inner plate that is dried after printing a metallic paste such as Au, Ag, Cu and the like on an unsintered ceramic plate; providing a tubular body that includes an opening for a cavity on another unsintered ceramic plate; overlapping the tubular body on the inner plate via a glass paste; and sintering the tubular body and the inner plate at a desirable temperature. The LED light source 1 can be made by encapsulating the LED chip 4 in the cavity with an encapsulating resin after the LED chip 4 is mounted on a bonding pad that is formed by drying the metallic paste.

An alumina, an aluminum nitride that has thermal conductivities nearly equal to that of aluminum, and the like, are used as the ceramic material, a. A glass epoxy board is frequently used as the mounting board 5. A metallic circuit board is also used as the mounting board 5 when the LED light source 1 is used to radiate heat generated from the LED chip such as a high flux type LED light source and so on. The metallic circuit board is made by forming conductive patterns on an insulating layer after the insulating layer is formed on a metallic palter having a high thermal conductivity such one that includes aluminum, etc.

In a soldering process for LED light sources, after a soldering paste is printed on a mounting board, the LED light source is mounted on a connecting location of the mounting board and is connected thereto mainly by a reflow soldering process in which the solder paste is melted using a heat source. The one reason for using this type of process is that electronic parts are miniaturized and also are closely mounted, and the other reason is that a solder including mercury is replaced with a mercury-free solder.

The above-referenced Patent Document is listed below, and is hereby incorporated with its English abstract in its entirety.

1. Patent Document No. 1: Japanese Patent Application Laid Open JP2005-159311

As described above, the ceramic package has characteristics such as permitting high radiating performance and excellent heat resistance properties in comparison with a resin molding package and/or plastic package, and therefore the ceramic package has been recently studied by the scientific community. An alumina, an aluminum nitride of which thermal conductivity is nearly equal to that of aluminum, and the like are used as the ceramic material. However, when heat generated from the ceramic package should be radiated to the outside, it may not be adequate to radiate the heat using the ceramic package alone.

Therefore, the ceramic package is attached to a metallic plate via a thermal conductive adhesive, or it can be mounted on the metallic circuit board based upon aluminum for practical purposes. However, when the LED light source using the ceramic package is mounted on the metallic circuit board based on aluminum having a high thermal conductivity, because the temperature of the LED light source is increased due to an ambient temperature and heat generated from other parts mounted on the circuit board, conditions for use of the LED light source become harsher.

Thus, because a difference between the temperature of the ceramic package during operating the LED light source and the non-operating temperature becomes very large, a difference between coefficients of thermal expansion of the mounting circuit board and the ceramic package causes the ceramic package to experience thermal fatigue. The thermal fatigue may cause cracks in connection(s) between the mounting circuit board and the ceramic package, and consequently may cause a disconnection between the LED light source and the mounting circuit board.

The disclosed subject matter has been devised to consider the above and other problems and characteristics. Thus, embodiments of the disclosed subject matter can include surface mount devices with high reliability even under a harsh environment and which can be made with a simple manufacturing process, and can include surface mount LED devices that can prevent cracks from forming in the ceramic package in the connection between the mounting board and the ceramic package under the above-described harsh environment.

SUMMARY

The presently disclosed subject matter has been devised in view of the above and other characteristics, desires, and problems in the conventional art, and to make certain changes to the existing light sources. An aspect of the disclosed subject matter includes providing surface mount LED devices with high reliability using the ceramic package that can be used under a harsh environment such as for vehicle lamps, outdoor lighting, and the like and which also can be simply composed by using the surface mount device of the disclosed subject matter.

According to another aspect of the disclosed subject matter, a surface mount device can include: a ceramic package having a mounting surface and a cavity, the mounting surface provided on an outside flat surface of the ceramic package, and the cavity provided with an opening and a bottom portion in the ceramic package; at least one chip-mounting pad disposed on the bottom portion in the cavity; conductor patterns located adjacent the at least one chip-mounting pad on the bottom portion; and at least one semiconductor optical chip having electrodes mounted on the at least one chip-mounting pad and each of electrodes thereof electrically connected to the conductor patterns. The surface mount device can also include two soldering pads located on the mounting surface of the ceramic package, each of the two soldering pads electrically connected to each of the electrodes of the at least one semiconductor optical chip via the conductor patterns, and at least one dummy soldering pad electrically insulated and configured to be located on both sides of the two soldering pads or on either side of the two soldering pads on the mounting surface.

In the above-described exemplary surface mount device, the at least one semiconductor optical chip can be a light-emitting chip or a light-receiving chip. In addition, at least one area of the soldering pads can be larger than an area of the at least one dummy soldering pad, and also the at least one of the soldering pads can be divided into a plurality of pads.

According to an exemplary surface mount device, thermal fatigue that may occur in the solder connections of the soldering pads that are electrically connected to each electrode of the semiconductor optical chip can be prevented because the distance between the soldering connections can be reduced. In addition, the dummy soldering pad can allow the device to maintain a desirable location with poise during the reflow soldering process, and also can reduce shear stress that may be present in the soldering connections that are electrically connected to the semiconductor optical chip electrodes. Thus, the device of the disclosed subject matter can maintain a high reliability even under harsh environmental conditions.

Another of the aspects of the disclosed subject matter includes a surface mount LED device that can include: a ceramic package having a mounting surface and a cavity, the mounting surface provided on an outside flat surface of the ceramic package and formed in a substantial rectangle shape having a length direction, and the cavity provided with an opening and a bottom portion in the ceramic package; at least one chip-mounting pad can be disposed on the bottom portion in the cavity; conductor patterns can be located adjacent the at least one chip-mounting pad on the bottom portion; and at least one LED chip having electrodes mounted on the at least one chip-mounting pad so as to emit light towards the opening of the cavity, and each of the electrodes of the LED chip can be electrically connected to the conductor patterns. The surface mount LED device can also include two soldering pads located adjacently in the length direction on the mounting surface and formed in a substantial rectangle shape, each of the two soldering pads electrically connected to each of the electrodes of the at least one LED chip via the conductor patterns; at least one dummy soldering pad can be electrically insulated, formed in a substantial rectangle shape, and configured to be located in the length direction on both sides of the two soldering pads or on either side of the two soldering pads on the mounting surface; and an encapsulating resin can be disposed in the cavity so as to encapsulate the at least one LED chip.

In the above-described exemplary surface mount LED device, the encapsulating resin can include at least one of a transparent resin and a mixture resin, the mixture resin including a resin mixed with at least one of a phosphor, a diffuser, and a pigment for selectively absorbing light having a predetermined wavelength. The ceramic package can be configured in a substantial cuboid shape, and the mounting surface can be located substantially perpendicular to the at least one chip-mounting pad. In addition, at least one width of the soldering pads in the length direction can be longer than a width of the at least one dummy soldering pad in the length direction.

According to the above-described exemplary surface mount LED device, the dummy soldering pad and the soldering pads that are electrically connected to the electrodes of the LED chip can be formed on the mounting surface of the ceramic package using the above-described structure of the surface mount device. Thus, a surface mount LED device with high reliability that can be used under harsh environmental conditions can be simple in composition according to the disclosed subject matter.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

The disclosed subject matter will now be described in detail with reference to FIGS. 2a-d, 3, and 5 to 8. When a ceramic package is mounted on a rigid mounting circuit board as described above, because thermal expansion coefficients of the mounting circuit board and the ceramic package may be different, a characteristic or problem can exist in which cracks are caused in a soldering connection between the mounting circuit board and the ceramic package, and may occur in particular during environmental tests such as a heat cycle test with a continuous current.

The characteristic/problem is frequently caused in the following cases.
1. In the case that the ceramic package is large in size according to a product specification.
2. In the case that a residual stress becomes large after soldering with a mercury-free solder having a high melting temperature.
3. In the case that a metallic circuit board is used, such as a glass composite board and a board based on an aluminum material in which thermal expansion coefficients of the aluminum material board are larger than that of a glass epoxy board.

Some considerations will now be described with respect to cracks that can be caused in the soldering connections due to thermal fatigue. A thermal displacement that is caused by a difference between thermal expansion coefficients of the ceramic package 2 of the side view type LED light source 1 shown in FIG. 1 and the mounting board 5 upon which the ceramic package is mounted is defined as $\Delta x$, the difference between the thermal expansion coefficients of the ceramic package and the mounting circuit board is defined as $\Delta \alpha$, a difference between the highest and lowest temperatures in the environmental temperature including the heat generated from the LED light source 1 is defined as $\Delta T$, and a length between the soldering connections 7a, 7b (a length of the package) is defined as L. The thermal displacement $\Delta x$ can be expressed in the following formula 1:

$$\Delta x = \Delta \alpha \times \Delta T \times L \quad \text{(formula 1)}$$

Figure 1A:
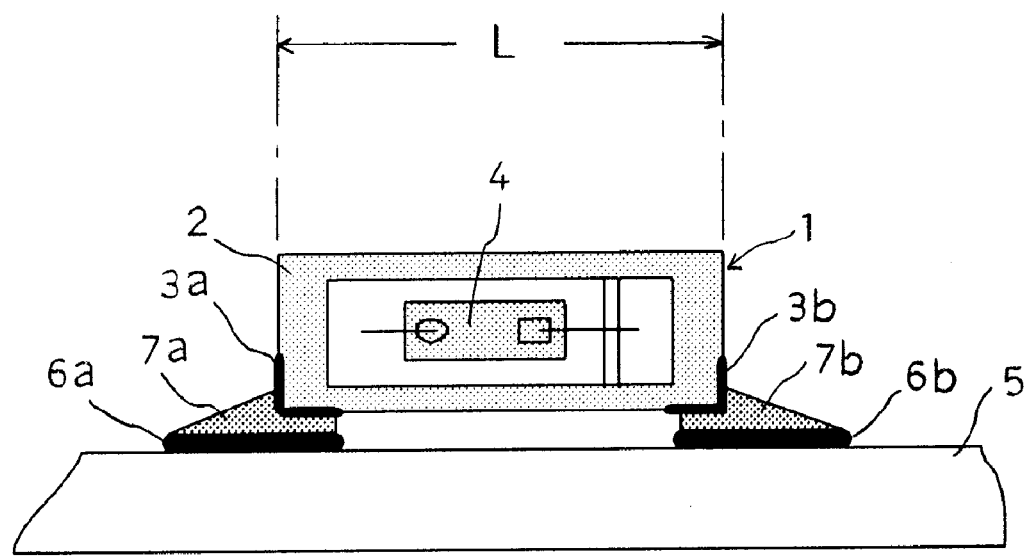
FIGS. 1a and 1b are front and side views, respectively, depicting a conventional side view type semiconductor device using a ceramic package.
Figure 1B:
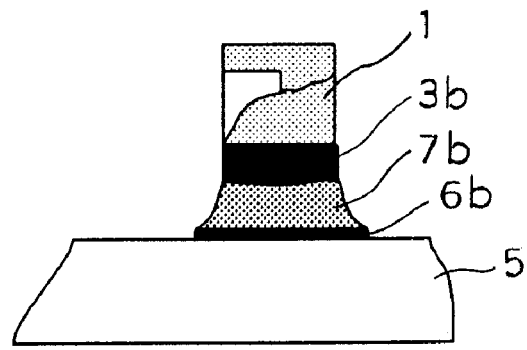

In FIG. 1, a thermal expansion coefficient $\alpha 1$ of the ceramic package 2 is $7 \times 10^{-6}$ ppm/K, a thermal expansion coefficient $\alpha 2$ of the metallic circuit board 5 based on use of an aluminum is $23 \times 10^{-6}$ ppm/K, and the length L of the package is 3 mil meters. The environmental temperature according to a general specification used for a vehicle is from −40 degrees centigrade to 120 degrees centigrade, and an additional temperature variable attributed to the self-heating of the light source 1 and the heating/cooling temperature generated from other parts that are turned on/off on the mounting circuit board 5 is 0 to 10 degrees centigrade. In this case, $\Delta \alpha$ is $16 \times 10^{-6}$ ppm/K, $\Delta T$ is 170K, and therefore $\Delta x$ is $8.16 \times 10^{-3}$ mil meters ($16 \times 10^{-6}$ ppm/K $\times 170$K $\times 3.0$ mm).

Consequently, the soldering connections 7a, 7b are subject to the repeated stress corresponding to the thermal displacement $\Delta x$ of around 8.2 micro meters. That is to say, the repeated stress corresponding to the thermal displacement $\Delta x$ of around 8.2 micro meters should be absorbed with the soldering connections 7a, 7b between the ceramic package 2 and the mounting circuit board 5. It is noted that the thermal fatigue in the soldering connections 7a, 7b depends on the repeated stress corresponding to the thermal displacement known as Coffin-Manson law.

When the LED light source 1 is subjected to a heat cycle test with a continuous current in order to be able to use in the environmental temperature, the thermal displacement results in a repeated shear stress, and the repeated shear stress accelerates the metallic fatigue. Therefore, it is going to be more likely that cracks are caused in the soldering connections 7a, 7b. When a thermal fatigue life is defined as N, the thermal displacement is defined as $\Delta x$, and constants that are determined by materials and the device environment are shown as C and n, the Coffin-Manson equation becomes the following formula 2.

$$N = C(\Delta x)^{-n} \quad \text{(formula 2)}$$

According to formula 1, the longer the length of package L, the larger the difference $\Delta \alpha$ a between the thermal expansion coefficients of the ceramic package and the mounting circuit board, the larger the thermal displacement $\Delta x$ becomes. Therefore, because stress loading becomes easier to experience at the soldering connections as shown in formula 2, a chance that the cracks are caused in the solder connections 7a, 7b increases.

In addition, it is noted that the thermal fatigue life of the soldering connections 7a, 7b widely depends on the maximum temperature of the soldering connections 7a, 7b and a repeated frequency between a high temperature and a low temperature as shown in the following modified Coffin-Manson equation (e.g. please see page 04 in volume 23 of Proceeding in 1984 of Japan Institute of Metals). When the thermal fatigue life is defined as N, the repeated frequency is defined as f, and the maximum temperature is defined as $T_{max}$, $N = f^m (\Delta x)^{-n} \exp(Ea/kT_{max})$. In this case, "Ea" is an activation energy, "k" is Boltzmann constant, "m" is a constant, and "n" is also a constant (n=1.9 to 2.0 in general in the case of thermal fatigue model for solder).

Therefore, fatigue acceleration is defined as K when the solder material and the environmental temperature are not changed and the length of package L becomes long or the difference $\Delta \alpha$ a between the thermal expansion coefficients of the ceramic package and the mounting circuit board becomes large, the thermal displacement is defined as $\Delta x2$ when the length of package L becomes long or the difference $\Delta \alpha$ between the thermal expansion coefficients of the ceramic package and the mounting circuit board becomes large, the thermal displacement of comparative standard is defined as $\Delta x1$, and "n" is a constant.

$$K = (\Delta x2 / \Delta x1)^{-n} \quad \text{(formula 3)}$$

According to formula 3, when "n" is 2 and the difference $\Delta \alpha$ between the thermal expansion coefficients of the ceramic package and the mounting circuit board becomes twice, the fatigue acceleration K is expected to becomes one/a fourth. The above thermal fatigue acceleration corresponds to twice as the length of package. When the mounting circuit board 5 of glass epoxy board is replaced with that of metallic board based on an aluminum, because the difference $\Delta \alpha$ between the thermal expansion coefficients is two times or more, the decrease of thermal fatigue acceleration is expected to be one/fourth or less.

Figure 2A:
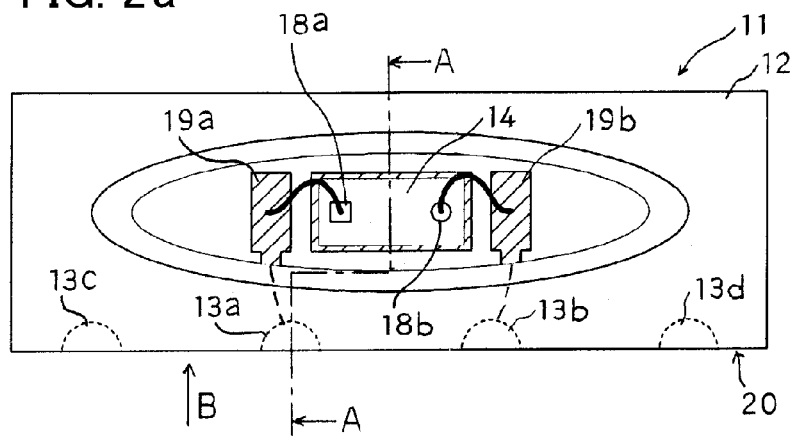
FIGS. 2a to 2d are schematic front, cross-sectional side, bottom, and rear views, respectively, showing a first exemplary embodiment of a surface mount device made in accordance with principles of the disclosed subject matter.
Figure 2B:
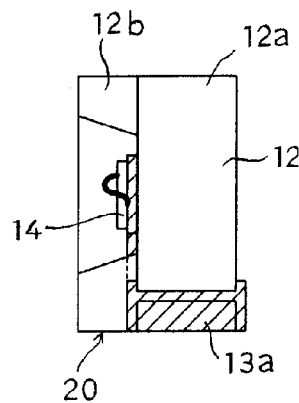
Figure 2C:
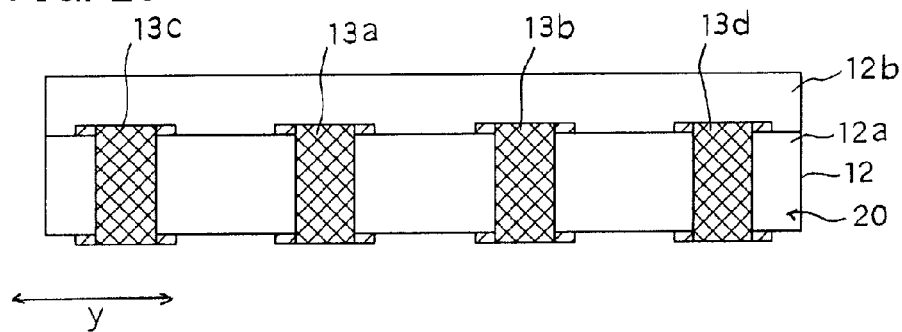
Figure 2D:
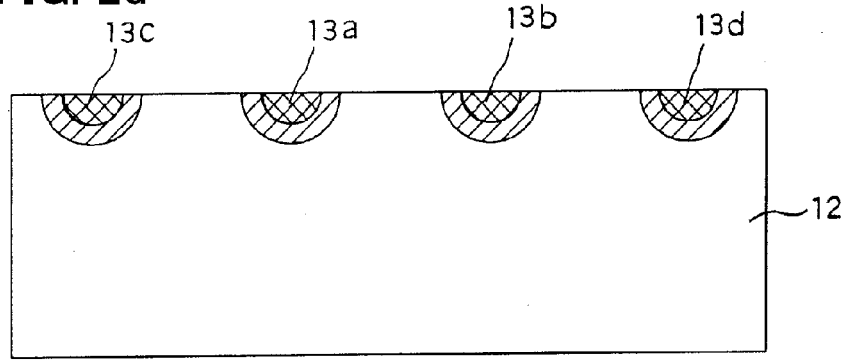

The disclosed subject matter relates to reliable surface mount devices using a ceramic package, in which the resistance of thermal fatigue can be improved in view of the above-described characteristics/problems and logical considerations. FIGS. 2a to 2d are schematic front, cross-section side, bottom, and rear views, respectively, showing a first exemplary embodiment of a surface mount device made in accordance with principles of the disclosed subject matter. The surface mount device 11 is a side view type semiconductor light-emitting/light-receiving device, FIG. 2b is a cross-section side view taken along line A-A of FIG. 2a, and FIG. 2c is a bottom view from a direction of arrow B.

The surface mount device 11 can include: a ceramic package 12; a semiconductor optical chip 14 (light-emitting chip/light-receiving chip) mounted on a chip-mounting pad of a bottom portion in a cavity of the ceramic package 12. Each of the semiconductor optical chip electrodes 18a, 18b can be electrically connected to conductor patterns 19a, 19b on the bottom portion of the cavity in the ceramic package 12, respectively. Each of the soldering pads 13a, 13b can include electrode terminals that are electrically connected to each of the semiconductor optical chip electrodes 18a, 18b via the conductor patterns 19a, 19b, respectively. Dummy soldering pads 13c, 13d can be electrically disconnected from the electrode terminals and located on both sides of the soldering pads 13a, 13b.

More specifically, the ceramic package 12 can include a cavity with an opening and a bottom portion for mounting the semiconductor optical chip 14 therein. The chip-mounting pad on the bottom portion can include at least one semiconductor optical chip 14 mounted thereon. The soldering pads 13a, 13b, 13c and 13d can be soldered on a mounting circuit board as described later when the surface mount device 11 is mounted on the mounting circuit board. The ceramic package 12 can be composed of a ceramic insulating board 12a and a ceramic reflective frame 12b. The soldering pads 13a, 13b, 13c and 13d can be formed by sintering "via holes" that are formed with a metallic paste such as Au, Ag, Cu, Pb, etc.

The ceramic package 12 can be made by the following processes. An unsintered ceramic plate is provided with holes, and "via holes" are formed by providing the holes with a metallic paste such as Au, Ag, Cu, Pb, etc. The metallic paste is painted on the ceramic plate, and the conductor patterns are formed by drying the metallic paste on the ceramic plate. Another ceramic plate is provided with holes for the cavity, and is overlapped with the above ceramic plate via a glass paste. The ceramic plates are sintered at a desirable temperature, and are divided into separate structures to form each ceramic package 12.

Thus, because a divided surface of the ceramic plates becomes a mounting surface 20, the mounting surface 20 including the soldering pads 13a to 13d can be formed in a substantial rectangle shape having a length direction shown as an arrow y in FIG. 2c in the above-described case. In addition, each of the soldering pads 13a to 13d can also be formed in a substantial rectangle shape on an outside flat surface of the ceramic package 12 because the soldering pads 13a to 13d are formed by dividing the via holes. The surface mount device 11 can also be formed in a substantial cubic shape. Furthermore, when the surface mount device 11 is used as a side view type device that can emit/receive light in parallel to the mounting surface 20, the mounting surface 20 can be formed substantially perpendicular to the chip-mounting pad on the bottom portion of the cavity.

Figure 3:
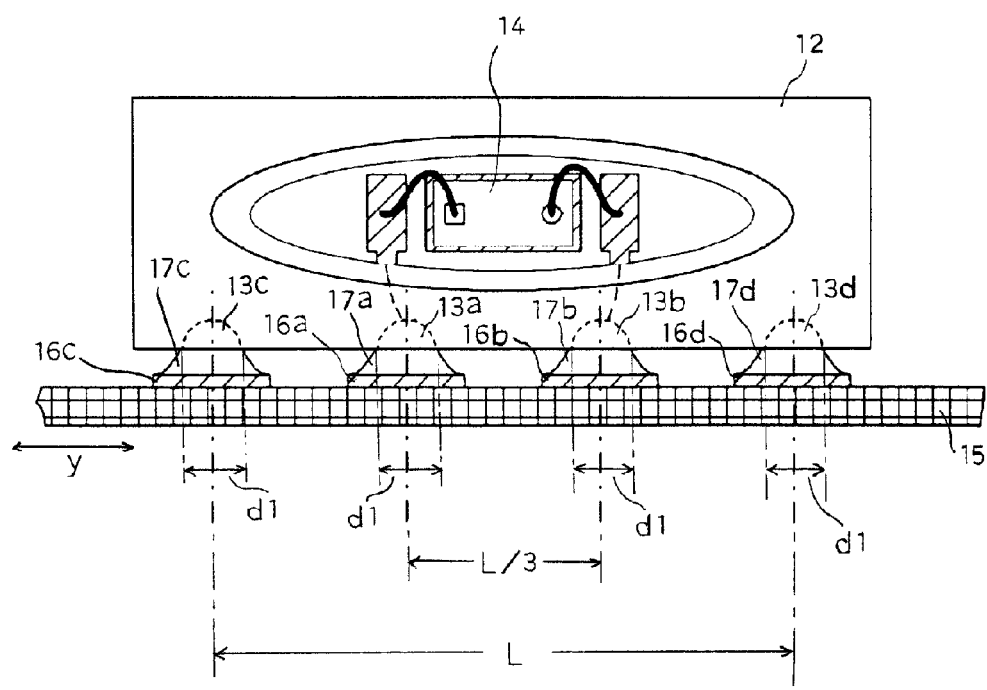
FIG. 3 is a front view showing a state of connecting each of the soldering pads of the surface mount device shown in FIG. 2 to conductor patterns of a mounting circuit board via a solder.

FIG. 3 is a front view showing a state in which each of the soldering pads 13a to 13d of the surface mount device 11 shown in FIG. 2 is connected to the conductor pattern(s) of a mounting circuit board 15 via a solder. The conductor patterns 16a, 16b, 16c and 16d on the mounting circuit board 15 correspond to the soldering pads 13a, 13b, 13c and 13d of the ceramic package 12. Soldering connections 17a, 17b, 17c and 17d are formed/located between the conductor patterns 16a to 16d and the soldering pads 13a to 13d, respectively.

Figure 4:
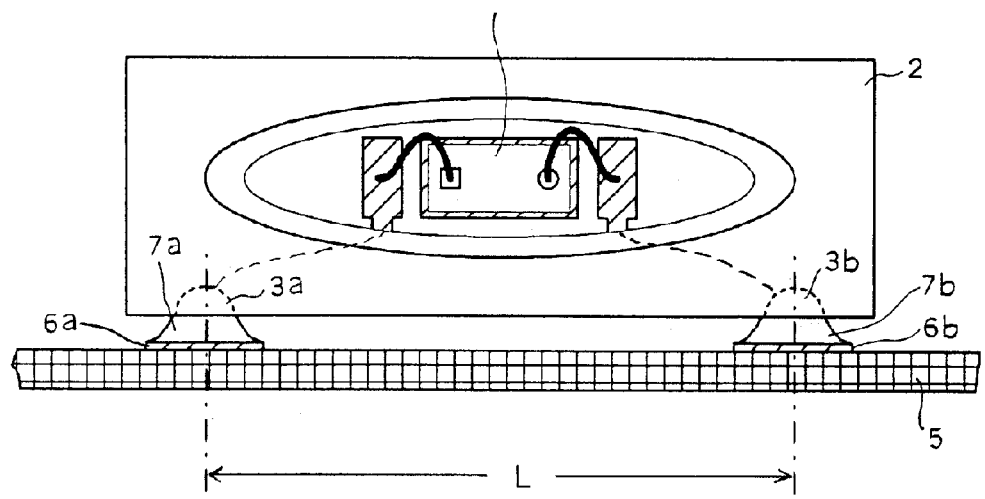
FIG. 4 is a front view showing a state of connecting each of the soldering pads of the conventional surface mount device shown in FIGS. 1a-b to conductor patterns of a mounting circuit board via a solder.

FIG. 4 is a front view showing a state of connection between each of the soldering pads 3a, 3b of the conventional surface mount device shown in FIG. 1 to the conductor patterns 6a, 6b of the mounting board 5 via solders 7a, 7b, respectively. According to the conventional light source of FIG. 4, the soldering pads 3a, 3b that are connected to electrodes of the LED chip 4 are formed on a mounting surface of the ceramic package 2, and can be connected to the conductor patterns 6a, 6b via solders 7a, 7b, respectively. In this case, the light source is generally mounted on the mounting board 5 by a reflow soldering process, and the soldering pads 3a, 3b are likely to be located on both ends of the mounting surface of the ceramic package 2 in order to be located on the conductor patterns 6a, 6b with poise. Therefore, a distance L between the soldering connections 7a, 7b becomes nearly equal to the length of ceramic package 2.

According to the surface mount device of FIG. 3, dummy soldering pads 13c, 13d can be provided to form fixing terminals on both ends of the device in order for the device to maintain a stable location/position during the reflow soldering process. The soldering pads 13a, 13b connected to each electrode of the semiconductor optical chip 14 can be located between the dummy soldering pads 13c, 13d. When the soldering pads 13a, 13b are evenly located between the dummy soldering pads 13c, 13d, the distance between the soldering pads 13a, 13b becomes L/3 when the distance between the dummy soldering pads 13c, 13d is L as shown in FIG. 3. Thus, the distance between the soldering connections 17a, 17b becomes one/third in comparison with the distance between the solder connections 7a, 7b of the conventional ceramic package 2 shown in FIG. 4.

In the above-described surface mount device 11, the device 11 can be located with poise using the dummy soldering pads 13c, 13d during the reflow soldering process. Also, the distance between the soldering connections 17a, 17b underneath the soldering pads 13a, 13b can become one/third in comparison with that of the conventional device. Thus, because the thermal displacement that is subjected to the soldering connections 17a, 17b can be reduced to one/third, the thermal fatigue life in the soldering connections 17a, 17b can be improved approximately nine times according to formula 3.

The soldering pads 13a, 13b, 13c, and 13d can be located on the mounting surface 20 of the ceramic package 12, which faces the mounting circuit board 15 in the reflow soldering process, and can be located in line in the direction of the arrow y shown in FIG. 2c. The width of each of the soldering pads 13a, 13b, 13c and 13d can be d1 in the direction of the arrow y as shown in FIG. 3, and each area of the soldering pads 13a, 13b, 13c and 13d can be the same. At least one of the soldering pads 13a, 13b for the electrode terminals can be wider in the direction of the arrow y than the dummy soldering pads 13c and 13d.

Figure 5:
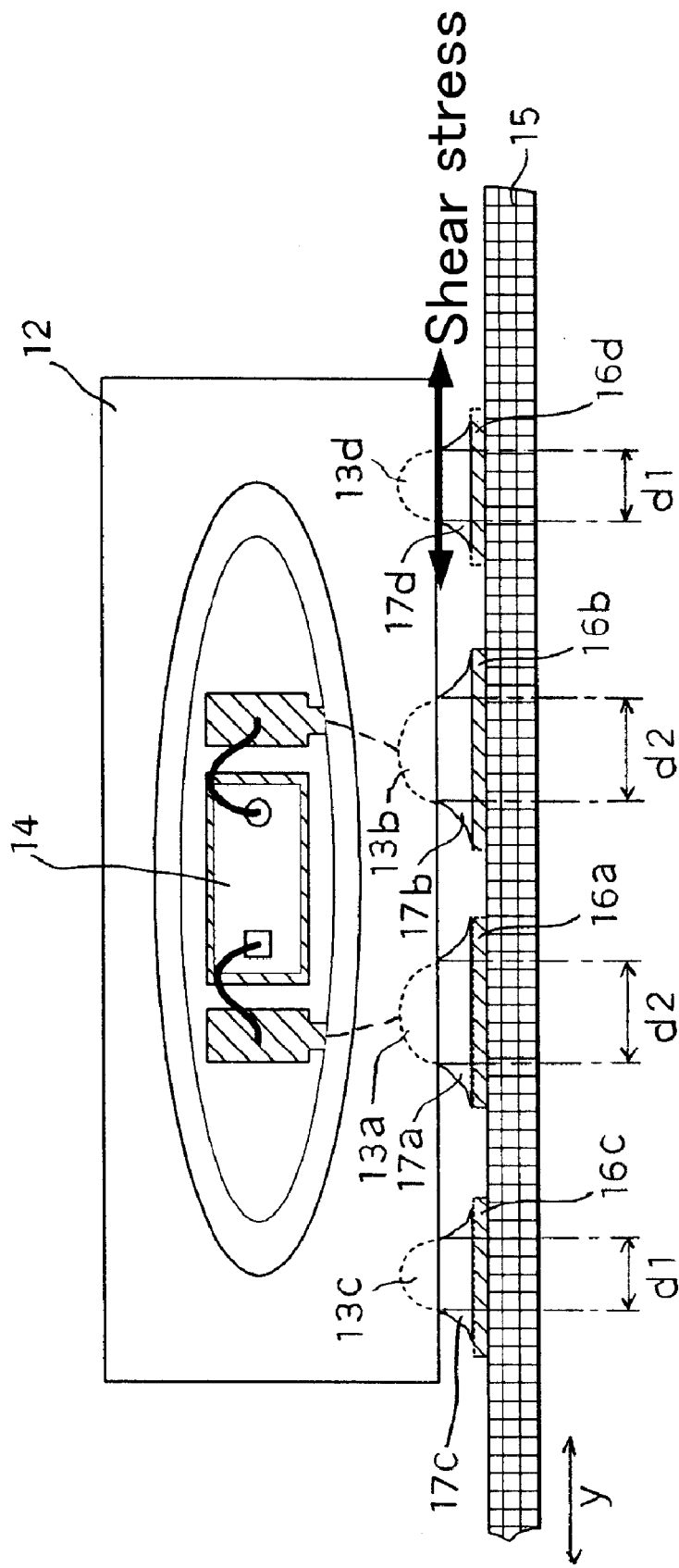
FIG. 5 is a schematic front view showing a variation of the first exemplary embodiment of the surface mount device shown in FIGS. 2a to 2d.

FIG. 5 is a schematic front view showing a variation of the first exemplary embodiment of the surface mount device shown in FIGS. 2a to 2d, in which the same or similar elements as those in FIGS. 2a to 2d are marked with the same numeral. Each of the widths of the soldering pads 13a, 13b for the electrode terminals can be d2 in the direction of arrow y, and can be wider than each width d1 of the dummy soldering pads 13c and 13d as shown in FIG. 5.

When the area of each of the soldering pads 13a, 13b for the electrode terminals is wider than the area of each of the dummy soldering pads 13c, 13d, as described above, a shear stress that may be caused in each of the soldering connections 17a, 17b of the soldering pads 13a, 13b can be reduced as compared to the shear stress that may be caused in each of the soldering connections 17c, 17d of the dummy soldering pads 13c, 13d. In addition, the amplitude of thermal displacement experienced by the soldering connections 17a, 17b of the soldering pads 13a, 13b for the electrode terminals may be less than that present at the soldering pads 17c, 17d of the dummy soldering pads 13c, 13d. Thus, the thermal fatigue life in the soldering connections 17a, 17b of the soldering pads 13a and 13b for the electrode terminals can be extremely improved (i.e., thermal fatigue can be reduced).

Figure 6:
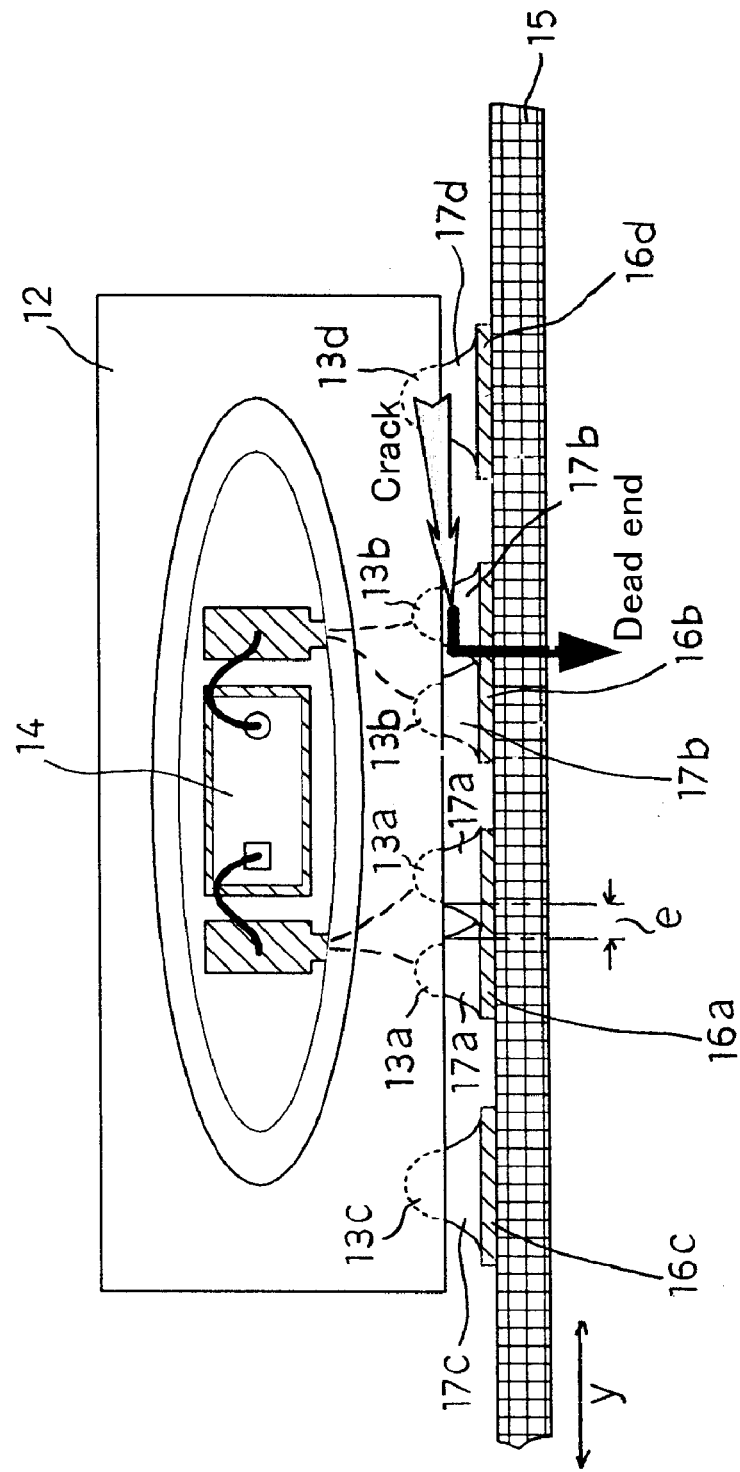
FIG. 6 is a schematic front view showing another exemplary embodiment of a surface mount device made in accordance with principles of the disclosed subject matter.

At least one of the soldering pads 13a, 13b of the electrode terminals can be divided into a plurality of pads in a direction of the arrow y, which is a direction of alignment of the soldering pads 13a to 13d. FIG. 6 is a schematic front view showing a structure for another exemplary embodiment of a surface mount device made in accordance with principles of the disclosed subject matter. The same or similar elements in FIG. 6 as those in FIGS. 3 and 5 are marked with the same numerals.

Each of the soldering pads 13a and 13b for the electrode terminals in the exemplary embodiment of FIG. 6 can be divided into the plurality of pads, and in particular can each be divided into two pads in a direction of the arrow y, which is the direction of alignment of soldering pads 13a to 13d as shown in FIG. 6. When each of the soldering pads 13a and 13b for the electrode terminals is divided into the plurality of pads in a direction of the arrow y, for instance, if cracks are caused in one of the soldering connections 17b underneath the soldering pads 13b, the cracks may not transmit to other of the plurality of soldering connections 17b but may stop on a dead end of the one soldering connection 17b.

Thus, when each of the soldering pads 13a and 13b for the electrode terminals is divided into a plurality of pads in the direction of the arrow y, even if cracks are caused in one of the soldering connections, the ceramic package 12 can prevent the cracks from transmitting to the other soldering connections. Therefore, the thermal fatigue life in the soldering connections 17a, 17b of the soldering pads 13a and 13b for the electrode terminals can be dramatically improved in this exemplary embodiment of the disclosed subject matter.

A thermal expansion coefficient of the soldering connections can be substantially the same as that of aluminum, however, can also be largely different from that of a ceramic. A portion at which shear stress is concentrated in the surface mount device may not be located between the soldering connections and the conductor patterns of the mounting circuit board, but may be located at a portion close to a boundary surface between the soldering pads for the electrode terminals and the soldering connections. Therefore, fillets of the soldering connections underneath the divided soldering pads may be connected on the boundary surfaces of the conductor patterns, however, they can be separate on each pad towards the ceramic package 12 of the soldering pads for the electrode terminals. Each distance "e" between the adjacent soldering pads for the electrode terminals can be 0.3 mil meters or more.

Each of the soldering pads 13a, 13b for the electrode terminals in FIG. 6 is divided into the two pads, however, these pads can be divided into three pads or more if desired. In addition, each of the soldering pads 13a, 13b is located between the dummy soldering pads 13c and 13d at the same interval, and the above-described interval between the soldering connections 17a and 17b of the soldering pads 13a, 13b for the electrode terminals can become L/3. However, the disclosed subject matter is not limited to the same interval.

Specifically, when the distance between the soldering connections 17c and 17d of the dummy soldering pads 13c, 13d is L, the interval between the soldering connections 17a and 17b of the soldering pads 13a, 13b for the electrode terminals can also become L/4. In this case, the distance between the soldering connections 17a, 17b underneath the soldering pads 13a and 13b can become one/fourth in comparison with that of the conventional light source. Thus, because the thermal displacement that is subjected to the soldering connections 17a, 17b can also be reduced to one/fourth, and the thermal fatigue life in the soldering connections 17a, 17b of the soldering pads 13a, 13b for the electrode terminals can be improved approximately sixteen times according to formula 3.

In the above-described exemplary embodiments, the dummy soldering pads 13c and 13d are located on both sides of the soldering pads 13a, 13b for the electrode terminals. However, one dummy solder pad can be located on either side of the soldering pads 13a, 13b for the electrode terminals. In this case, when each of the soldering pads is located at the same interval, the distance between the soldering connections 17a, 17b of the soldering pads 13a, 13b for the electrode terminals may become L/2. The thermal fatigue life in the soldering connections 17a, 17b of the soldering pads 13a and 13b for the electrode terminals can be improved in comparison with that of the conventional light source while the chance of a short between the soldering connections 17a, 17b of the soldering pads 13a, 13b for the electrode terminals may be reduced.

When one dummy solder pad is located on either side of the soldering pads 13a, 13b of the electrode terminals, at least one of the soldering pads 13a, 13b can be wider than the dummy soldering pad in the direction of the arrow y, which is the direction of alignment of the three soldering pads. In other words, at least one area of the soldering pads 13a, 13b can be larger than that of the dummy soldering pad, and the larger soldering pad can be located in an outward direction of the ceramic package 12.

Figure 7:
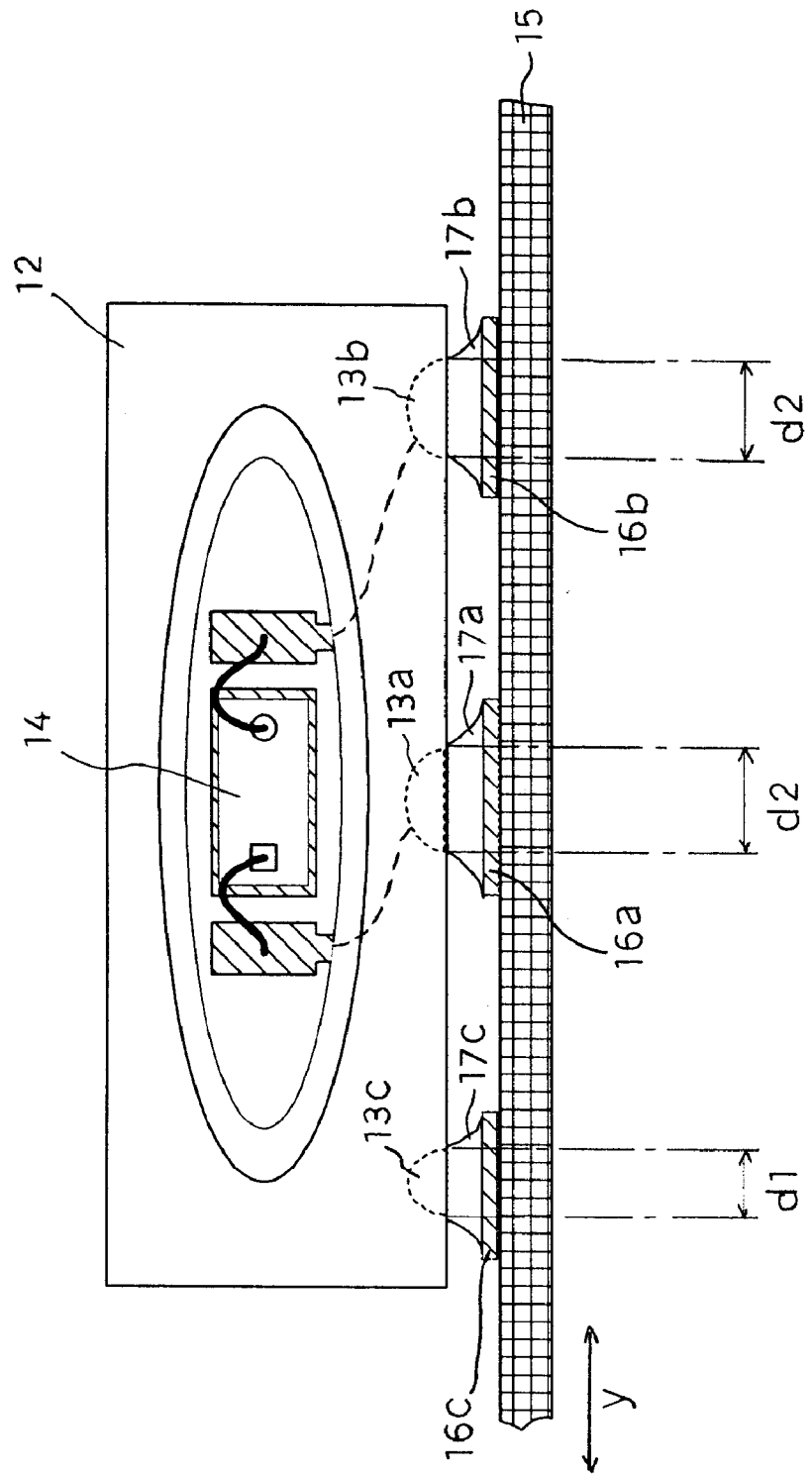
FIG. 7 is a schematic front view showing another exemplary embodiment of a surface mount device made in accordance with principles of the disclosed subject matter.

FIG. 7 is a schematic front view showing another exemplary embodiment of a surface mount device made in accordance with principles of the disclosed subject matter. The same or similar elements in FIG. 7 as those shown in FIG. 5 are marked with the same numerals as in FIG. 5. When a dummy solder pad 13c is located on either side of the soldering pads 13a, 13b of the electrode terminals, each width d2 of the soldering pads 13a and 13b can be wider than a width d1 of the dummy soldering pad 13c in FIG. 7.

In the exemplary embodiment shown in FIG. 7, if the width of each of the soldering pads 13a, 13b, 13c is the same, because the distances between each of the outward soldering pads 13b, 13c and the center of the ceramic package 12 on the soldering pad 13a is about the same, cracks that may be caused may occur equally in both soldering connections 17b, 17c during the reflow soldering process. However, because the width d2 of the outward soldering pad 13b for the electrode terminal is wider than the width d1 of the dummy soldering pad 13c, the amplitude of thermal displacement may concentrate mainly at the soldering connection 17c of the dummy soldering pad 13c.

Consequently, the shear stress that is caused in each of the soldering connections 17a, 17b of the soldering pads 13a, 13b of the electrode terminals can be reduced as compared to that in the soldering connection 17c of the dummy soldering pad 13c. In addition, the amplitude of thermal displacement may not be large in the soldering connections 17a, 17b, but may be larger and occur mainly in the soldering connection 17c of the dummy soldering pad 13c. Thus, the thermal fatigue life in the soldering connections 17a, 17b of the soldering pads 13a and 13b of the electrode terminals can be improved. In the above-described exemplary embodiments, at least one of the soldering pads 13a, 13b for the electrode terminals can be divided into a plurality of pads in the direction of the arrow y shown in FIG. 7.

When each of the soldering pads 13a and 13b for the electrode terminals as described above are divided into a plurality of soldering pads in the direction of the arrow y that is the direction in which the soldering pads 13a to 13c are aligned on the ceramic package 12, for example, if cracks are caused in one of the soldering connections underneath the plurality of soldering pads, the cracks may be prevented from transmitting to other whole soldering connections and may stop on a dead end of the one soldering connection.

Therefore, even if cracks are caused in one of the soldering connections underneath the plurality of divided soldering pads, the ceramic package 12 can prevent the cracks from transmitting to the other soldering connections. The thermal fatigue life in the soldering connections 17a, 17b of the soldering pads 13a and 13b of the electrode terminals can be dramatically improved. The thermal expansion coefficient of the soldering connections can be substantially the same as that of an aluminum material, however, can be largely different from that of the ceramic package 12. Therefore, the portion at which shear stress is concentrated in the surface mount device may not be located between the soldering connections and the conductor patterns of the mounting circuit board 15, but may be located at a portion close to a boundary surface between the soldering pads for the electrode terminals and the soldering connections.

Thus, fillets of the soldering connections underneath the divided soldering pads may be connected on the boundary surfaces of the conductor patterns, however, and separate each pad portion from the ceramic package 12 of the soldering pads for the electrode terminals. Each distance e between the adjacent soldering pads of the electrode terminals can be 0.3 mil meters or more. The distance between the soldering pads 13a, 13b for the electrode terminals in FIG. 7 can become L/2 because the soldering pads 13a, 13b, 13c can be located at the same interval, however, the interval is not necessarily limited to the same interval. More specifically, when the distance between the outward soldering pad 13b and the outward dummy soldering pad 13c is L, the interval between the soldering connections 17a and 17b of the soldering pads 13a, 13b for the electrode terminals can also become L/4.

The disclosed subject matter can be especially useful for use in semiconductor devices using the ceramic package having a length L of 3 mil meters or more. When the length L of the ceramic package 12 is longer than 3 mil meters, the chance for causing cracks in the soldering connections may be increased when used without the disclosed dummy soldering pad especially after carrying out a round of heat cycle testing such as set forth in a vehicle manufacturer specification. However, the ceramic package 12 that is provided with the above-described dummy soldering pads 13c and/or 13d can provide favorable results for surface mount devices intended for use on a vehicle.

Figure 8:
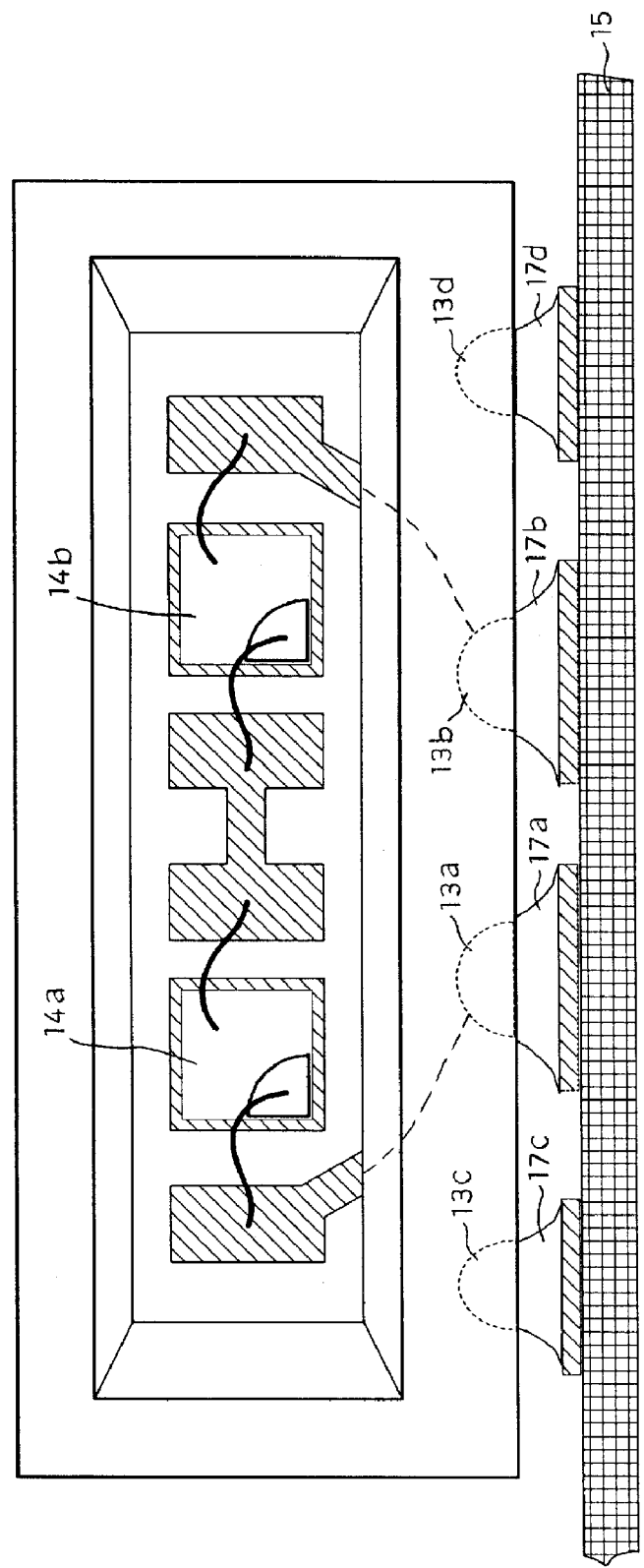
FIG. 8 is a schematic front view showing another exemplary embodiment of a surface mount device made in accordance with principles of the disclosed subject matter.

FIG. 8 is a schematic front view showing a variation of a surface mount device made in accordance with principles of the disclosed subject matter. For example, when a plurality of semiconductor optical chips is connected in series, the disclosed subject matter can provide a surface mount device for the plurality of semiconductor optical chips which includes the above-described ceramic package in which the resistance of thermal fatigue can be improved. The surface mount device shown in FIG. 8 can include semiconductor optical chips 14a, 14b connected in series and soldering pads 13a to 13d which can be configured as shown in FIG. 5.

In this case, the semiconductor optical chips 14a, 14b can also be connected in parallel, and the plurality of chips can also be optionally connected in series and/or in parallel if the soldering pad 13a and 13b are used as the two electrode terminals on the ceramic package. In addition, the surface mount light-emitting/light-receiving devices are described above as being side view types that emit/receive a light substantially in parallel with the mounting circuit board 15. However, the devices can also be used for a top view type device that emits/receives light substantially in a perpendicular direction away from the mounting circuit board 15. The devices can also be used for emitting/receiving light to/from various directions by changing an angle between the mounting surface and the semiconductor chip-mounting pad of the ceramic package. Moreover, a protection chip for reducing static electricity and/or backward voltage and a resistance for controlling the driving current can also be mounted in and/or on the ceramic package.

A description of a surface mount LED device using the above-described structure will now be given. When an LED chip is employed as the semiconductor optical chip and an encapsulating resin is disposed in the cavity of the ceramic package so as to encapsulate the LED chip, the disclosed subject matter can provide a reliable surface mount LED device having the above-described characteristics. The encapsulating resin can include at least one of a transparent resin and a mixture resin, the mixture resin including a resin mixed with at least one of a phosphor, a diffuser, and a pigment for selectively absorbing light having a predetermined wavelength. Thus, the surface mount LED device can emit light emitted from the LED chip, and can also emit a different colored light from that emitted from the LED chip using the mixture resin.

For example, when the surface mount device 11 emits white light, the LED chip 14 can be a blue LED chip that emits a blue light with a peak wavelength of 450 nm, and the phosphor of the mixture resin can be a yellow phosphor such as YAG: Ce, (Ca, Sr, Ba)$_2$SiO$_4$:Eu and the like for converting blue light to a complementary yellow light. A part of the blue light emitted from the blue LED chip 14 excites the phosphor and converts it to yellow light, which can be mixed with other parts of the blue light emitted from the blue LED chip by means of additive color mixture. Thus, the surface mount device 11 can emit light having an approximately white color tone.

In the above-described exemplary embodiments, the ceramic package is described as having a substantial cuboid shape and the soldering pads are described as having a substantial rectangular shape. However, these shapes are not limited to those specifically described above, and various other shapes can be used according to the intended usage, the specification of the product, etc. Thus, the disclosed subject matter can provide a surface mount device with high reliability that can be used under harsh environments such as for a vehicle lamp, an outdoor lighting device, and so on. Various modifications of the above disclosed embodiments can be made without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A surface mount optical device, comprising:
a ceramic package having a mounting surface and a cavity, the mounting surface located on an outside flat surface of the ceramic package, and the cavity including an opening and a bottom portion in the ceramic package;
at least one chip-mounting pad disposed at the bottom portion in the cavity of the ceramic package;
at least one conductor pattern located adjacent the at least one chip-mounting pad at the bottom portion in the cavity;
at least one semiconductor optical chip having electrodes mounted on the at least one chip-mounting pad and located towards the opening of the cavity with respect to the chip mounting pad, and each of the electrodes being electrically connected to the at least one conductor pattern;
two soldering pads located adjacent the mounting surface of the ceramic package, each of the two soldering pads electrically connected to a respective one of the electrodes of the at least one semiconductor optical chip via the at least one conductor pattern; and
at least one dummy soldering pad electrically insulated from the electrodes of the at least one semiconductor optical chip, aligned with the two soldering pads on a mounting surface, and located at least one of,
on either side of the two soldering pads on the mounting surface, and
on one side of both of the two soldering pads on the mounting surface.

2. The surface mount optical device according to claim 1, wherein the at least one semiconductor optical chip is at least one of a light-emitting chip and a light-receiving chip.

3. The surface mount optical device according to claim 2, wherein at least a total area of one of the soldering pads is larger than a total area of the at least one dummy soldering pad.

4. The surface mount optical device according to claim 3, wherein at least one of the soldering pads is divided into a plurality of pads.

5. The surface mount optical device according to claim 2, wherein at least one of the soldering pads is divided into a plurality of pads by at least one fillet.

6. The surface mount optical device according to claim 1, wherein at least a total area of one of the soldering pads is larger than a total area of the at least one dummy soldering pad.

7. The surface mount optical device according to claim 6, wherein at least one of the soldering pads is divided into a plurality of pads.

8. The surface mount optical device according to claim 1, wherein at least one of the soldering pads is divided into a plurality of pads.

9. A surface mount optical device, comprising:
a ceramic package having a mounting surface and a cavity, the mounting surface located on an outside flat surface of the ceramic package and formed in a substantial rectangle shape having a length direction, and the cavity including an opening and a bottom portion in the ceramic package;
at least one chip-mounting pad disposed at the bottom portion in the cavity of the ceramic package;
at least one conductor pattern located adjacent the at least one chip-mounting pad at the bottom portion in the cavity;
at least one LED chip having electrodes mounted on the at least one chip-mounting pad so as to emit light towards the opening of the cavity during operation, and each of the electrodes being electrically connected to the at least one conductor pattern;
two soldering pads located adjacent to each other and aligned in parallel with the length direction on the mounting surface of the ceramic package and formed in a substantial rectangle shape as viewed from the mounting surface of the device, each of the two soldering pads electrically connected to a respective one of the electrodes of the at least one LED chip via the at least one conductor pattern;
at least one dummy soldering pad electrically insulated from the electrodes of the at least one LED chip and formed in a substantial rectangle shape as viewed from the mounting surface of the device, and aligned in the length direction with the two soldering pads on the mounting surface, and located at least one of,
on either side of the two soldering pads on the mounting surface, and
on one side of both of the two soldering pads on the mounting surface; and
an encapsulating resin disposed in the cavity so as to encapsulate the at least one LED chip.

10. The surface mount optical device according to claim 9, wherein the encapsulating resin includes at least one of a transparent resin and a mixture resin, the mixture resin including a resin mixed with at least one of a phosphor, a diffuser, and a pigment configured to selectively absorb light having a predetermined wavelength.

11. The surface mount optical device according to claim 10, wherein the ceramic package is configured in a substantial cuboid shape.

12. The surface mount optical device according to claim 11, wherein the mounting surface is substantially perpendicular to a top mounting surface of the at least one chip-mounting pad to which the LED chip is mounted.

13. The surface mount optical device according to claim 12, wherein a width of at least one of the soldering pads in the length direction is longer than a width of the at least one dummy soldering pad in the length direction.

14. The surface mount optical device according to claim 11, wherein a width of at least one of the soldering pads in the length direction is longer than a width of the at least one dummy soldering pad in the length direction.

15. The surface mount optical device according to claim 10, wherein a width of at least one of the soldering pads in the length direction is longer than a width of the at least one dummy soldering pad in the length direction.

16. The surface mount optical device according to claim 9, wherein the ceramic package is configured in a substantial cuboid shape.

17. The surface mount optical device according to claim 16, wherein the mounting surface is substantially perpendicular to a top mounting surface of the at least one chip-mounting pad to which the LED chip is mounted.

18. The surface mount optical device according to claim 17, wherein a width of at least one of the soldering pads in the length direction is longer than a width of the at least one dummy soldering pad in the length direction.

19. The surface mount optical device according to claim 16, wherein a width of at least one of the soldering pads in the length direction is longer than a width of the at least one dummy soldering pad in the length direction.

20. The surface mount optical device according to claim 9, wherein a width of at least one of the soldering pads in the length direction is longer than a width of the at least one dummy soldering pad in the length direction.

21. A surface mount optical device, comprising:
a ceramic package having a mounting surface and a cavity, the cavity including an opening and a bottom portion in the ceramic package, the mounting surface located on an outside flat surface of the ceramic package and including an insulating board surface formed in a substantial rectangle shape having a length direction, wherein the bottom portion of the cavity is formed on and co-planar with a side of the insulating board surface of the mounting surface and extends in the length direction of the insulating board surface;
at least one chip-mounting pad disposed at the bottom portion in the cavity of the ceramic package;
at least one conductor pattern located adjacent the at least one chip-mounting pad at the bottom portion in the cavity;
at least one semiconductor optical chip having electrodes mounted on the at least one chip-mounting pad and located towards the opening of the cavity with respect to the chip mounting pad, and each of the electrodes being electrically connected to the at least one conductor pattern;
two soldering pads exposed from the insulating board surface of the mounting surface of the ceramic package, each of the two soldering pads being electrically connected to a respective one of the electrodes of the at least one semiconductor optical chip via the at least one conductor pattern; and
at least one dummy soldering pad electrically insulated from the electrodes of the at least one semiconductor optical chip, exposed from the insulating board surface of the mounting surface of the ceramic package, aligned with the two soldering pads in the length direction of the insulating board surface of the mounting surface, and located at least one of,
on either side of the two soldering pads on the mounting surface, and
on one side of both of the two soldering pads on the mounting surface, and
wherein each of the at least one dummy soldering pad and the two soldering pads crosses the insulating board surface of the mounting surface of the ceramic package in a direction substantially perpendicular to the length direction of the insulating board surface.

22. The surface mount optical device according to claim 21, wherein the at least one dummy soldering pad and the two soldering pads are formed at substantially equal intervals between adjacent soldering pads.

* * * * *